(12) United States Patent
Nozawa

(10) Patent No.: US 12,337,434 B2
(45) Date of Patent: Jun. 24, 2025

(54) SUBSTRATE PRODUCTION SYSTEM

(71) Applicant: FUJI CORPORATION, Chiryu (JP)

(72) Inventor: Mizuho Nozawa, Kota-cho (JP)

(73) Assignee: FUJI CORPORATION, Chiryu (JP)

( * ) Notice: Subject to any disclaimer, the term of this patent is extended or adjusted under 35 U.S.C. 154(b) by 101 days.

(21) Appl. No.: 18/256,118

(22) PCT Filed: Dec. 23, 2020

(86) PCT No.: PCT/JP2020/048110
§ 371 (c)(1),
(2) Date: Jun. 6, 2023

(87) PCT Pub. No.: WO2022/137379
PCT Pub. Date: Jun. 30, 2022

(65) Prior Publication Data
US 2024/0033869 A1    Feb. 1, 2024

(51) Int. Cl.
*B23Q 7/14* (2006.01)
*H05K 13/02* (2006.01)

(52) U.S. Cl.
CPC ......... *B23Q 7/1421* (2013.01); *B23Q 7/1431* (2013.01)

(58) Field of Classification Search
CPC .. B23Q 7/1421; B23Q 7/1431; H05K 13/021; B65G 47/90; B65G 2203/00; B07C 5/38
USPC ............................................. 198/619, 346.1
See application file for complete search history.

(56) References Cited

U.S. PATENT DOCUMENTS

| | | | | |
|---|---|---|---|---|
| 8,033,288 | B2 * | 10/2011 | Shiomi | H01L 21/67781 414/222.01 |
| 8,960,099 | B2 * | 2/2015 | Hosek | H01L 21/67766 414/749.2 |
| 2006/0137726 | A1 * | 6/2006 | Sano | H01L 21/67028 118/696 |
| 2015/0148934 | A1 * | 5/2015 | Maenishi | G05B 19/418 700/121 |

(Continued)

FOREIGN PATENT DOCUMENTS

| | | | | |
|---|---|---|---|---|
| CN | 105532082 | A * | 4/2016 | ........ H05K 13/021 |
| JP | 5-175686 | A | 7/1993 | |

(Continued)

OTHER PUBLICATIONS

International Search Report issued Mar. 16, 2021 in PCT/JP2020/048110 filed on Dec. 23, 2020, 3 pages.

*Primary Examiner* — Gene O Crawford
*Assistant Examiner* — Muhammad Awais
(74) *Attorney, Agent, or Firm* — Oblon, McClelland, Maier & Neustadt, L.L.P.

(57) ABSTRACT

A substrate production system includes a component mounter having a component supply area in which a component supply unit is disposed, and configured to pick up a component from the component supply unit and mount the picked up component on a substrate, a kitting station provided in a substrate production line in which multiple substrate production machines including the component mounter are arranged, and configured to set a component container containing multiple components in the component supply unit, and a conveyance device configured to convey the component supply unit in which the component container is set by the kitting station to the component mounter.

13 Claims, 6 Drawing Sheets

(56) References Cited

U.S. PATENT DOCUMENTS

2017/0354070 A1* 12/2017 Kobayashi ........... H05K 13/086
2018/0242485 A1* 8/2018 Kondo ............... H05K 13/0473

FOREIGN PATENT DOCUMENTS

WO     WO-2015019412 A1 * 2/2015 ........... H05K 13/086
WO     WO 2017/033268 A1    3/2017

* cited by examiner

Fig. 9

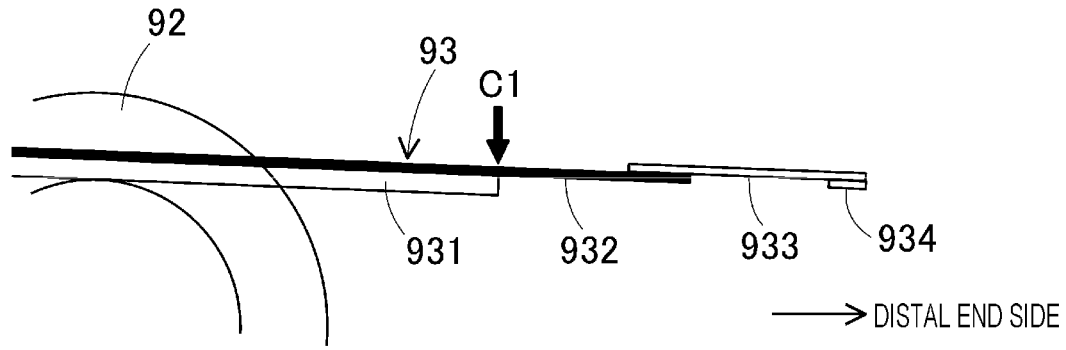

→ DISTAL END SIDE

Fig. 10

| USE PLAN | USE PERIOD | CONTAINING POSITION |
|---|---|---|
| PRESENCE | SUBSTRATE TYPE THAT IS BEING PRODUCED | UPPER STAGE OF SECOND SPARE CONTAINING SECTION 224 |
| | SUBSTRATE TYPE TO BE PRODUCED NEXT | LOWER STAGE OF SECOND SPARE CONTAINING SECTION 224 |
| | SUBSTRATE TYPE TO BE PRODUCED LATER THAN SUBSTRATE TYPE AFTER NEXT SUBSTRATE TYPE | FIRST SPARE CONTAINING SECTION 37 |
| ABSENCE | REUSE IS EXPECTED | FIRST SPARE CONTAINING SECTION 37 |
| | WHETHER TO REUSE IS UNCLEAR | STORAGE WAREHOUSE (53, 57) AFTER REEL IS REMOVED |

SUBSTRATE PRODUCTION SYSTEM

TECHNICAL FIELD

The present specification relates to a substrate production system that performs production of a substrate using a substrate production line in which multiple substrate production machines including a component mounter are arranged.

BACKGROUND ART

A technique of mass-producing a substrate including an electronic circuit by performing work such as mounting of a component on a printed wiring substrate is widespread. Further, it is common to configure a substrate production line by arranging multiple types of substrate production machines that performs the work. A component mounter among the substrate production machines uses a component supply unit in which a component container that contains multiple components is set. A tape feeder, which is a typical example of the component supply unit, uses a reel around which a carrier tape is wound as a component container.

Kitting work of setting the component container (reel) in the component supply unit (tape feeder) is required for component replenishment work when the components are consumed as the production progresses, or setup change work of changing the type of the substrate (substrate type) to be produced. This type of kitting work has been conventionally performed by manpower. In addition, a method of preparing the component supply unit for which the kitting work has been completed in advance and exchanging the component supply unit as required is also performed. Patent Literatures 1 and 2 disclose technical examples related to the kitting work or the exchange work of the component supply unit.

Patent Literature 1 discloses a tape reel supply robot that loads a tape reel into a tape feeder set in a component mounter. With this configuration, automatic exchanging of the tape reel can be performed to eliminate a loss of an operating time or the like.

In addition, a component mounting line of Patent Literature 2 includes a unit storage warehouse that stores multiple component supply units, and a unit exchange device that exchanges component supply units attached to multiple component mounters and the component supply units in the unit storage warehouse. With this configuration, regardless of the component supply unit used in any of the component mounters, conveying-in and conveying-out such as replenishment or collection can be performed between the component supply unit and the unit storage warehouse, and the unit storage warehouse having excellent usability can be provided.

PATENT LITERATURE

Patent Literature 1: JP-A-H05-175686
Patent Literature 2: International Publication WO 2017/033268

BRIEF SUMMARY

Technical Problem

Incidentally, the tape reel supply robot of Patent Literature 1 is preferable in that the kitting work that has been performed by manpower can be automated. However, since the tape reel supply robot sequentially performs the work of loading the tape reel in each of a large number of tape feeders in a case of the above-described setup change work, a work time is increased. As a result, there arises a problem that the production efficiency is deteriorated.

In contrast, in the configuration of Patent Literature 2, the component supply unit for which the kitting work has been completed is stored in advance in the unit storage warehouse, and the work time is reduced by the work of exchanging the component supply unit in the setup change work, so that the production efficiency can be promoted. However, in a case where the kitting work is automatically performed in a kitting station in order to save labor, a conveyance vehicle that conveys the component supply unit between the kitting station and the unit storage warehouse which are disposed at a distance is required. There is a risk that the work time of the setup change work may be extended due to the restriction on the conveyance operation of the conveyance vehicle. Further, there is a risk that the exchange work may not be streamlined due to the restriction on the number of spare component supply units.

Therefore, the present specification is to provide a substrate production system that realizes high production efficiency by streamlining the component replenishment work or the setup change work related to a component mounter.

Solution to Problem

The present specification discloses a substrate production system including a component mounter having a component supply area in which a component supply unit is disposed, and configured to pick up a component from the component supply unit and mount the picked up component on a substrate, a kitting station provided in a substrate production line in which multiple substrate production machines including the component mounter are arranged, and configured to set a component container containing multiple components in the component supply unit, and a conveyance device configured to convey the component supply unit in which the component container is set by the kitting station to the component mounter.

Advantageous Effects

In the substrate production system disclosed in the present specification, the kitting station is provided in the substrate production line. Therefore, the conveyance device only needs to move a short distance when conveying the component supply unit in which the component container is set from the kitting station to the component mounter, so that the conveyance can be performed in a short time. Therefore, it is possible to streamline the component replenishment work or the setup change work related to the component mounter, and as a result, it is possible to realize high production efficiency.

BRIEF DESCRIPTION OF DRAWINGS

FIG. 9 is a diagram illustrating a variation of a position at which an initial waste tape is cut from a distal end of a carrier tape.

FIG. 10 is a table showing a reference of a containing position of the tape feeder in the embodiment.

DESCRIPTION OF EMBODIMENTS

Figure 1:
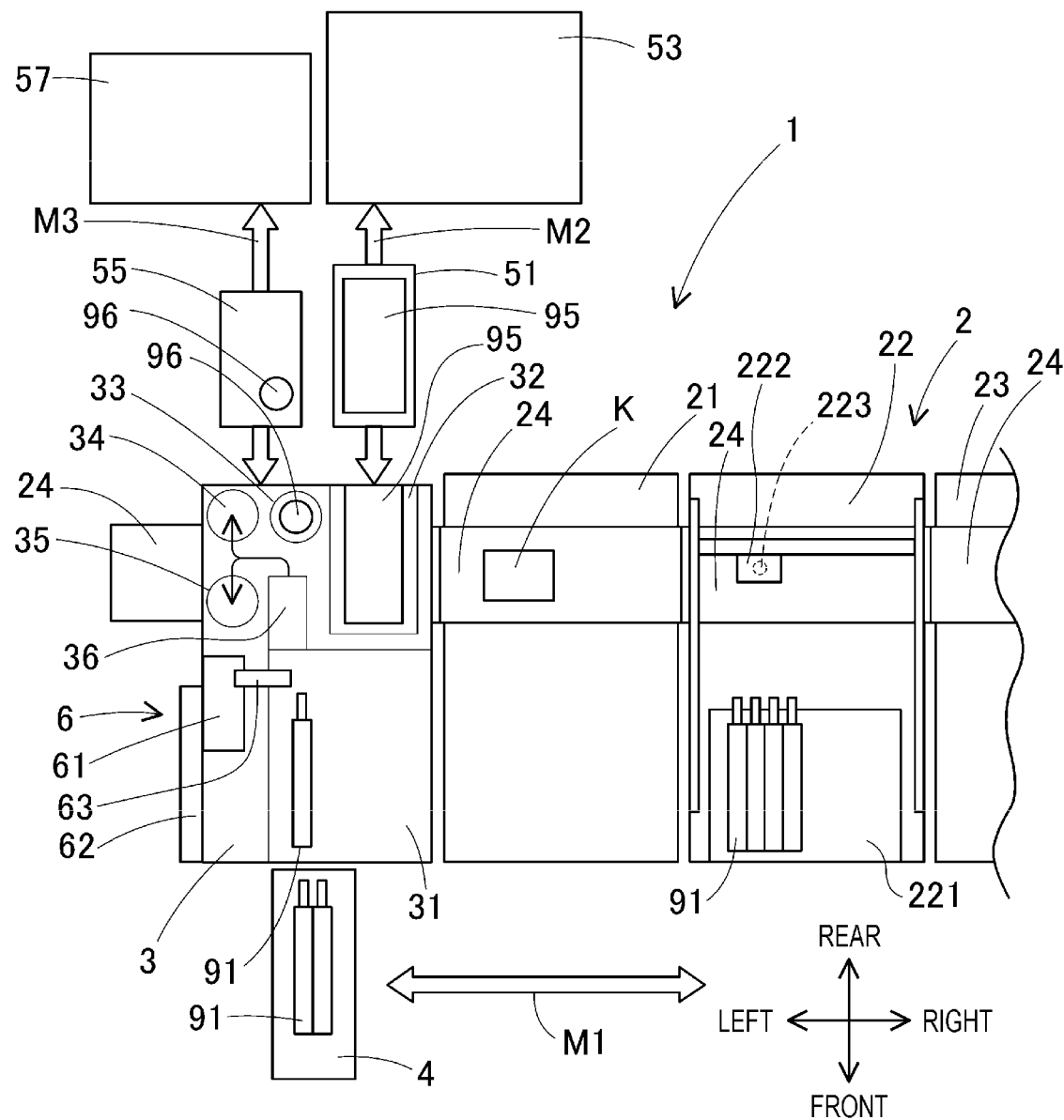
FIG. 1 is a plan view schematically illustrating a configuration of a substrate production system of an embodiment.

1. Substrate Production Line 2 and Component Mounter 22

A configuration of substrate production system 1 of the embodiment will be described with reference to FIGS. 1 to 7. Each of the drawings is a schematic explanatory view because there are portions that are scaled out. As illustrated in the lower right of FIGS. 1 and 2, the front, rear, left, and right directions are defined for convenience. Substrate production system 1 includes substrate production line 2 including component mounter 22 as a minimum configuration, kitting station 3, and conveyance device 4. In the present embodiment, substrate production system 1 includes, in addition to the above configuration, two types of conveyance vehicles (feeder conveyance vehicle 51 and reel conveyance vehicle 55), waste tape collection device 6, setup control section 7, production plan storage section 71, and the like.

Substrate production line 2 is configured by arranging multiple substrate production machines including component mounter 22. For example, substrate production line 2 illustrated in FIGS. 1 and 2 includes solder printer 21, component mounter 22, and substrate inspector 23 which are arranged from the left to the right. Each of the multiple substrate production machines has conveyance conveyor 24 extending in the left-right direction at a substantially intermediate height position. Each of conveyance conveyors 24 is rotationally driven by conveyor driving section 25 disposed on the lower side. As a result, substrate K is sequentially conveyed from solder printer 21 on an upstream side to the substrate production machine on a downstream side.

Figure 3:
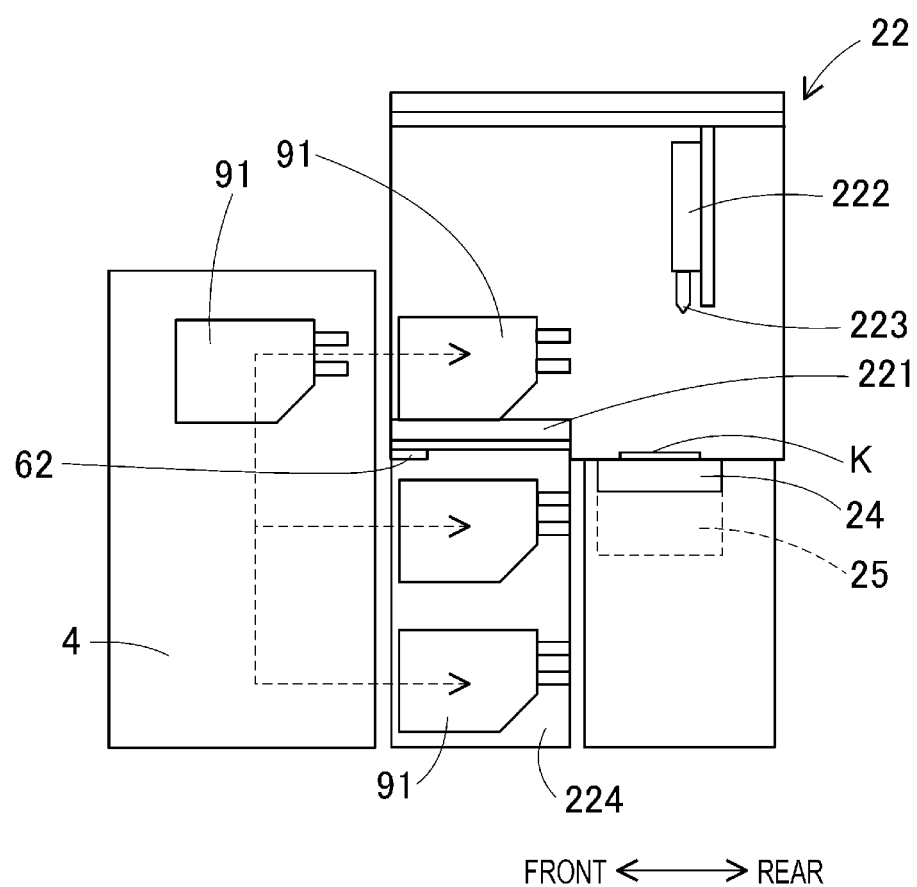
FIG. 3 is a side cross-sectional view of a component mounter as viewed from a right direction.

As illustrated in FIG. 3, component mounter 22 includes component supply area 221, mounting head 222, suction nozzle 223, and second spare containing section 224. Component supply area 221 is provided at a substantially intermediate height position on a front side, and tape feeders 91 to be used in the present production are arranged. Component supply area 221 is formed using a plate-shaped member in which multiple groove-shaped slots extending in the front-rear direction are provided.

Multiple tape feeders 91 are inserted into each of multiple slots of component supply area 221 from a front side and are detachably disposed. Tape feeder 91 supplies a component by using reel 92 (see FIGS. 5 and 9) around which carrier tape 93 is wound. Carrier tape 93 has multiple cavities arranged in a line in a tape length direction. Each of the cavities accommodates the component. Tape feeder 91 is a form of a component supply unit, and reel 92 is a form of a component container.

A label indicating an individual identification code is attached to tape feeder 91 and reel 92. The label is read by component mounter 22, kitting station 3, or the like, so that the individuals of tape feeder 91 and reel 92 are identified. However, the configuration is not limited to this, but a configuration may be adopted in which the individual identification codes of tape feeder 91 and reel 92 are stored in a built-in memory of tape feeder 91. In this configuration, when tape feeder 91 is set in component mounter 22 or kitting station 3 and is communicatively connected, the individual identification code is transmitted and identified.

Component mounter 22 includes mounting head 222 at a position closer to an upper portion of an inner space. Mounting head 222 is driven by a horizontal driving mechanism (not illustrated) to move in two horizontal directions. Mounting head 222 holds one or multiple suction nozzles 223 such that the suction nozzles 223 can be lifted and lowered. Conveyance conveyor 24 traverses a substantially intermediate height position behind component mounter 22. Conveyance conveyor 24 conveys substrate K on which the solder paste is printed by solder printer 21 in component mounter 22.

Then, mounting head 222 moves to an upper side of tape feeder 91, and suction nozzle 223 is lowered to pick up the component from tape feeder 91 and then is lifted. Next, mounting head 222 moves to an upper side of substrate K, and suction nozzle 223 is lowered to mount the component on the solder paste of substrate K. When the pickup operation and the mounting operation are repeated, components of tape feeder 91 are consumed and a component shortage state is established. In the component replenishment work in this case, tape feeder 91 is exchanged instead of exchange of reel 92. In addition, in the setup change work when changing a substrate type of substrate K, multiple tape feeders 91 are exchanged in many cases.

Component mounter 22 includes second spare containing section 224 on a lower side of component supply area 221 on a front side. Second spare containing section 224 includes an upper stage and a lower stage having a structure similar to component supply area 221, respectively. Second spare containing section 224 can contain multiple tape feeders 91 that are not used in the present production in the upper stage and the lower stage, respectively. Tape feeder 91 contained in second spare containing section 224 is in a state ready for use in which reel 92 has been set, and is used in the component replenishment work or the setup change work. It should be noted that second spare containing section 224 may have a configuration of only one stage or a configuration of three or more stages.

2. Kitting Station 3

Figure 4:
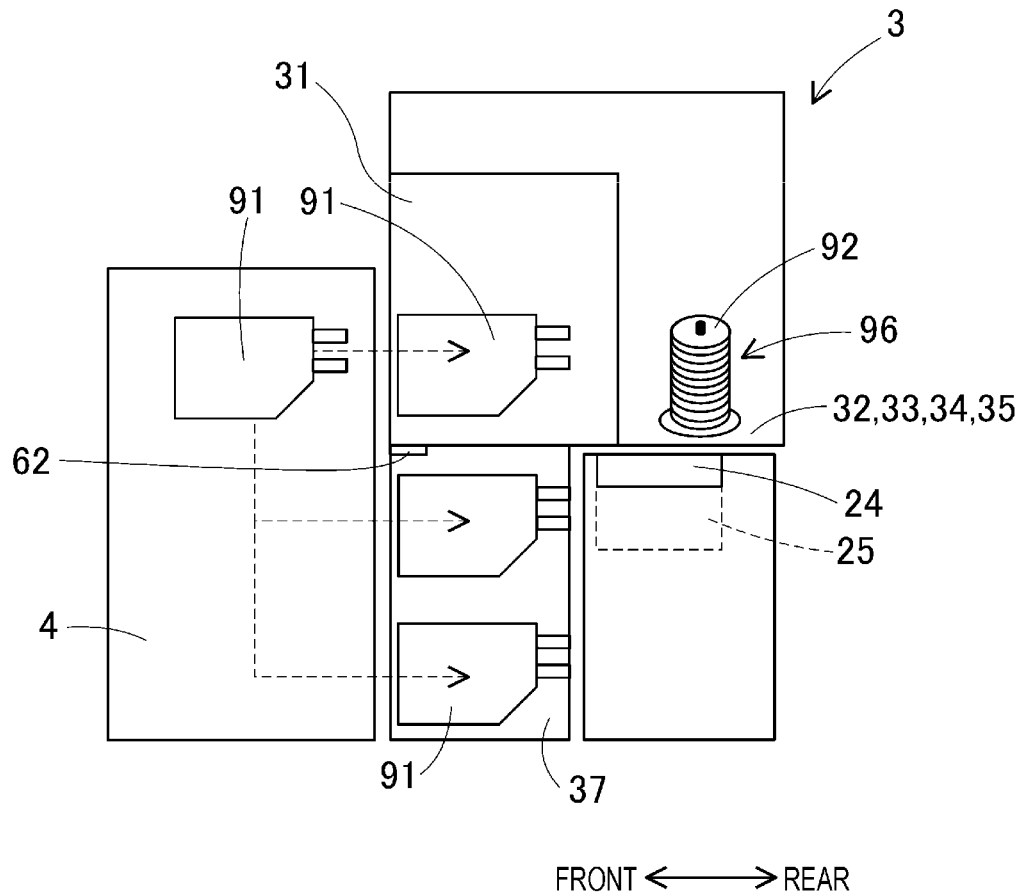
FIG. 4 is a side cross-sectional view of a kitting station as viewed from the right direction.
Figure 5:
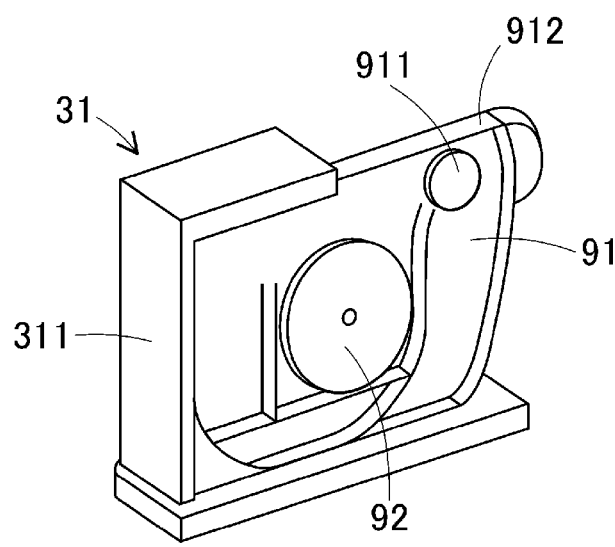
FIG. 5 is a perspective view schematically illustrating a kitting execution section of the kitting station.

Kitting station 3 is provided in substrate production line 2, specifically, provided on a left side of solder printer 21. The configuration is not limited to this, but kitting station 3 may be provided between solder printer 21 and component mounter 22, or on a right side (downstream side) of component mounter 22. As illustrated in FIG. 4, kitting station 3 has a small dimension in the front-rear direction on a lower side and a large dimension on an upper side, and has a space provided in a rear lower portion. Conveyance conveyor 24 and conveyor driving section 25 are disposed in this space. Conveyance conveyor 24 receives substrate K on a left side of kitting station 3, and delivers substrate K to conveyance conveyor 24 of solder printer 21. Kitting station 3 has kitting execution section 31, spare containing section attachment and detachment section 32, magazine accepting section 33, magazine feed-out section 34, reel discarding section 35, classification section 36, and first spare containing section 37.

Kitting execution section 31 is disposed at a position closer to a front right side of a large upper portion of kitting station 3 in the front-rear direction (see FIGS. 1 and 4). Kitting execution section 31 includes feeder holding section 311 illustrated in FIG. 5, a work robot (not illustrated), and the like. The work robot causes feeder holding section 311 to hold tape feeder 91, which is a work target, at the beginning of the kitting work. Next, the work robot rotationally sets reel 92 at a predetermined position substantially at the center of tape feeder 91.

Next, the work robot pulls out carrier tape 93 from reel 92 to perform predetermined loading work. As a result, carrier tape 93 is driven and pulled out by sprocket 911, so that carrier tape 93 can be fed to component supply position 912. In other words, tape feeder 91 is in the state ready for use. In the loading work of carrier tape 93, work of cutting a part of a distal end side of carrier tape 93 occurs as required (described in detail later).

In addition, the work robot performs removal work of holding tape feeder 91 collected from component supply area 221 of component mounter 22 in feeder holding section 311 and removing reel 92. The work robot includes, for example, an arm-type robot having a movable arm. Further, the work robot may be configured by combining a movement mechanism for moving tape feeder 91 or reel 92. Kitting execution section 31 is controlled by kitting control section 72 (see FIG. 8).

Spare containing section attachment and detachment section 32 is disposed at a position closer to a rear right side of the upper portion of kitting station 3. Spare containing section attachment and detachment section 32 is a section for detachably providing magazine-type spare containing section 95. Magazine-type spare containing section 95 is formed in a box shape having an opening portion (see FIG. 6). Magazine-type spare containing section 95 contains multiple tape feeders 91 in an arranged manner. Bi-directional transport of tape feeder 91 is enabled between magazine-type spare containing section 95 disposed in spare containing section attachment and detachment section 32 and kitting execution section 31.

Magazine accepting section 33 is disposed on a left side of spare containing section attachment and detachment section 32. Magazine accepting section 33 is a section for accepting reel magazine 96 (component container magazine). Reel magazine 96 includes a circular bottom plate and a mandrel extending upward from the center of the bottom plate (see FIG. 7). Reel magazine 96 contains multiple reels 92 loaded in a stacked manner in the up-down direction by the engagement of the mandrel in a center hole of reel 92. Reel 92 can be transported from reel magazine 96 disposed in magazine accepting section 33 to kitting execution section 31.

Magazine feed-out section 34 is disposed on a left side of magazine accepting section 33 at a position closer to a rear left side of the upper portion of kitting station 3. Magazine feed-out section 34 is a section for feeding out reel magazine 96. Reel 92 can be transported from kitting execution section 31 to reel magazine 96 disposed in magazine feed-out section 34 via classification section 36. Magazine accepting section 33 and magazine feed-out section 34 configure a magazine attachment and detachment section having two positions for detachably providing reel magazine 96. It should be noted that magazine accepting section 33 and magazine feed-out section 34 may be simplified to a magazine attachment and detachment section having only one position.

Reel discarding section 35 is disposed on a front side of magazine feed-out section 34. Reel discarding section 35 is a section for collecting empty reel 92 in which the components are consumed and there is no carrier tape 93. Classification section 36 is disposed at a position closer to a rear left side of kitting execution section 31. Classification section 36 classifies reel 92 removed by kitting execution section 31. That is, classification section 36 feeds reel 92 in which the component still remains and carrier tape 93 is half used to magazine feed-out section 34 and causes reel 92 to be contained in reel magazine 96. In addition, classification section 36 feeds empty reel 92 to reel discarding section 35. Classification section 36 is controlled by classification control section 73 (see FIG. 8).

Figure 2:
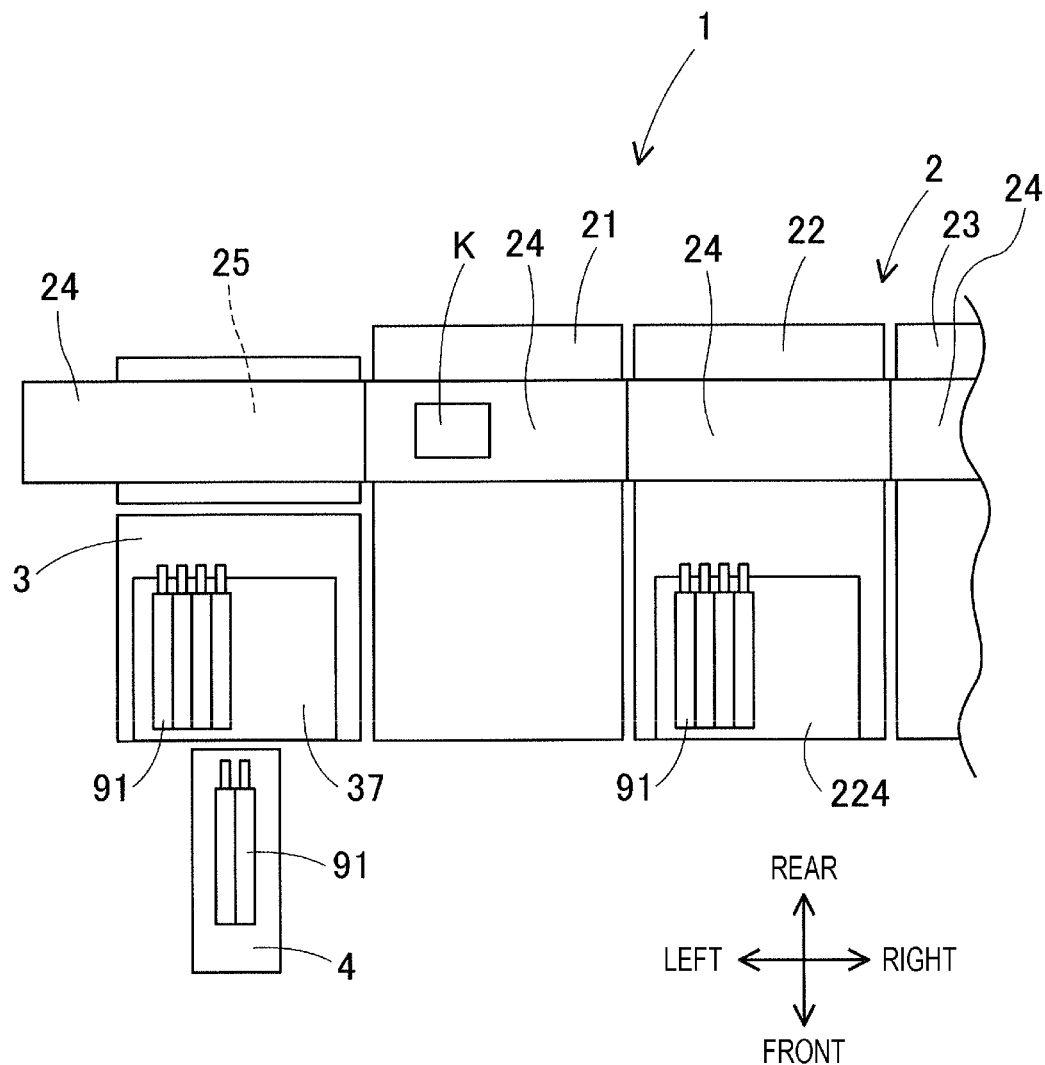
FIG. 2 is a plan partial cross-sectional view schematically illustrating a configuration of a lower portion of the substrate production system.

First spare containing section 37 is disposed at a small lower portion in the front-rear direction of kitting station 3 (see FIGS. 2 and 4). First spare containing section 37 includes an upper stage and a lower stage having a structure similar to second spare containing section 224 of component mounter 22. First spare containing section 37 can contain multiple tape feeders 91 that are not used in the present production in the upper stage and the lower stage, respectively. It should be noted that first spare containing section 37 may have a different structure from second spare containing section 224.

3. Conveyance Device 4

Conveyance device 4 performs various conveyance operations, including a conveyance operation of conveying tape feeder 91 on which reel 92 is set by kitting station 3 to component mounter 22. As indicated by arrow M1 in FIG. 1, conveyance device 4 moves from a front side of kitting station 3 to the front side of component mounter 22.

Specifically, a guide rail and a non-contact power supply section are provided on a front surface of each substrate production machine configuring substrate production line 2 and a front surface of kitting station 3. Meanwhile, conveyance device 4 has an engagement section and a non-contact power reception section on a rear surface thereof, and has a moving motor in an inner side thereof. The engagement section of conveyance device 4 engages with the guide rail to guide the movement of conveyance device 4. The non-contact power reception section of conveyance device 4 receives power from the non-contact power supply section and supplies power to the moving motor. As a result, conveyance device 4 is driven by the moving motor to move in the left-right direction. Conveyance device 4 is not limited to the above configuration, and may have, for example, a structure of a conveyance vehicle that autonomously travels with a storage battery.

As indicated by dashed-line arrows in FIG. 3, conveyance device 4 has a function of delivering tape feeder 91 to and from component supply area 221 or second spare containing section 224 of component mounter 22. In addition, as indicated by dashed-line arrows in FIG. 4, conveyance device 4 has a function of delivering tape feeder 91 to and from kitting execution section 31 or first spare containing section 37 of kitting station 3. Further, conveyance device 4 has a function of moving in a state in which received tape feeder 91 is held in the device, and a function of lifting and lowering tape feeder 91 in the device.

Therefore, conveyance device 4 can perform the conveyance operation of conveying tape feeder 91 between the respective sections described above. Conveyance device 4 is controlled by setup control section 7 (see FIG. 8). It should be noted that the applicants disclose a detailed configuration example of conveyance device 4 in Patent Literature 2 under the name of [Exchange Robot].

4. Feeder Conveyance Vehicle 51 and Reel Conveyance Vehicle 55

Figure 6:
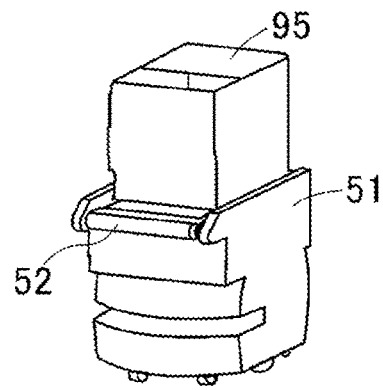
FIG. 6 is a perspective view of a feeder conveyance vehicle that conveys a magazine-type spare containing section.

As illustrated in FIG. 6, feeder conveyance vehicle 51 travels with magazine-type spare containing section 95 loaded thereon. Although not illustrated in FIG. 6, magazine-type spare containing section 95 contains multiple tape feeders 91 in an arranged manner. Feeder conveyance vehicle 51 conveys magazine-type spare containing section 95 between spare containing section attachment and detachment section 32 of kitting station 3 and feeder storage warehouse 53 (see arrow M2 in FIG. 1). Feeder conveyance vehicle 51 includes, on the upper surface thereof, roller device 52 that automatically performs reloading of magazine-type spare containing section 95.

When the number of tape feeders 91 in kitting station 3 is insufficient, feeder conveyance vehicle 51 can automatically replenish the insufficient number of tape feeders 91 from feeder storage warehouse 53. In addition, feeder conveyance vehicle 51 can automatically store surplus tape feeders 91 generated in kitting station 3 in feeder storage warehouse 53. Further, feeder conveyance vehicle 51 can improve the conveyance efficiency by performing the conveyance in a state in which multiple tape feeders 91 are contained in magazine-type spare containing section 95. It should be noted that feeder conveyance vehicle 51 may be configured to convey one or more tape feeders 91 without using magazine-type spare containing section 95.

Figure 7:
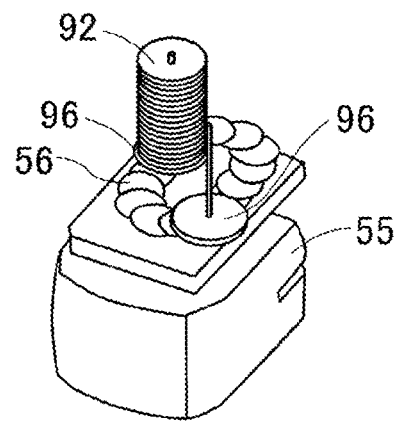
FIG. 7 is a perspective view of a reel conveyance vehicle that conveys a reel magazine (component container magazine).

As illustrated in FIG. 7, reel conveyance vehicle 55 travels with multiple reel magazines 96 (component container magazines) loaded thereon. In the example of FIG. 7, one reel magazine 96 is fully loaded with reels 92 and another reel magazine 96 is empty. Reel conveyance vehicle 55 conveys reel magazine 96 between magazine accepting section 33 and magazine feed-out section 34 of kitting station 3 and reel storage warehouse 57 (see arrow M3 in FIG. 1). Reel conveyance vehicle 55 includes, on the upper surface thereof, annular conveyor device 56 that adjusts the position of reel magazine 96 to automate the reloading.

Reel conveyance vehicle 55 can automatically replenish reels 92 required in kitting station 3 from reel storage warehouse 57. In addition, reel conveyance vehicle 55 can automatically store half-used reel 92 generated in kitting station 3 in reel storage warehouse 57. Further, reel conveyance vehicle 55 can improve the conveyance efficiency by performing the conveyance in a state in which multiple reels 92 are loaded on reel magazine 96. It should be noted that reel conveyance vehicle 55 may be configured to convey one or more reels 92 without using reel magazine 96. Feeder conveyance vehicle 51 and reel conveyance vehicle 55 are controlled by setup control section 7 (see FIG. 8).

Each of feeder conveyance vehicle 51 and reel conveyance vehicle 55 may be plural. Further, the traveling paths of feeder conveyance vehicle 51 and reel conveyance vehicle 55 can be deformed into a double-line form, a circular form, or the like. In addition, feeder conveyance vehicle 51 and reel conveyance vehicle 55 may have the same shape, and magazine-type spare containing section 95 and reel magazine 96 may be mounted and conveyed together. Further, feeder storage warehouse 53 and reel storage warehouse 57 may be a common storage warehouse.

5. Waste Tape Collection Device 6

Waste tape collection device 6 collects an initial waste tape of carrier tape 93. The initial waste tape is generated in the loading work when kitting execution section 31 of kitting station 3 sets reel 92 in tape feeder 91. Further, waste tape collection device 6 also collects a waste tape generated after component mounter 22 uses carrier tape 93. In addition, component mounter 22 includes a tape cutting section that cuts used carrier tape 93 into a predetermined length to form the waste tape. As illustrated in FIG. 1, waste tape collection device 6 includes collection box 61, waste tape conveyor 62, and collection slope 63.

Collection box 61 is loaded at a predetermined position set closer to the left side surface of the upper portion of kitting station 3. Collection box 61 is formed in a box shape that is open upward. Collection box 61 contains and collects the initial waste tape and the waste tape described above. Collection box 61 is removed from the predetermined position by an operator, and the initial waste tape and the waste tape in collection box 61 are discarded.

As illustrated in FIG. 3, waste tape conveyor 62 uses, as a start point, a front upper portion of second spare containing section 224 of component mounter 22. At the start point of waste tape conveyor 62, the waste tape is loaded by the tape cutting section of component mounter 22. Waste tape conveyor 62 extends from the start point to a front upper portion of first spare containing section 37 of kitting station 3 via a front side of solder printer 21 (see FIG. 4). Further, waste tape conveyor 62 is refracted at a left front side of kitting station 3 and extends to collection box 61 along a left side surface of kitting station 3 (see FIG. 1). Waste tape conveyor 62 operates in conjunction with the operation of component mounter 22 to convey and collect the waste tape into collection box 61.

Collection slope 63 is formed in an inclined slope shape in which an upper start point is disposed in kitting execution section 31 and a lower end point is disposed on an upper side of collection box 61. Collection slope 63 includes an inclined bottom surface and two side surfaces, or is formed in an inclined tubular shape. The initial waste tape is loaded on the upper start point of collection slope 63 by the work robot of kitting execution section 31. The initial waste tape slides down along the inclination of collection slope 63, drops toward collection box 61, and is collected.

With the configuration of waste tape collection device 6, the labor for discard by the operator is reduced as compared with a case where kitting station 3 and component mounter 22 are discarded separately. Further, since reel discarding section 35 is disposed in a vicinity of collection box 61, the operator can discard empty reel 92 in conjunction with the discarding of the waste tape, so that the labor is further reduced. It should be noted that a configuration may be adopted in which collection slope 63 is omitted, and the work robot of kitting execution section 31 puts the initial waste tape into collection box 61.

6. Configuration of Control of Substrate Production System 1

Figure 8:
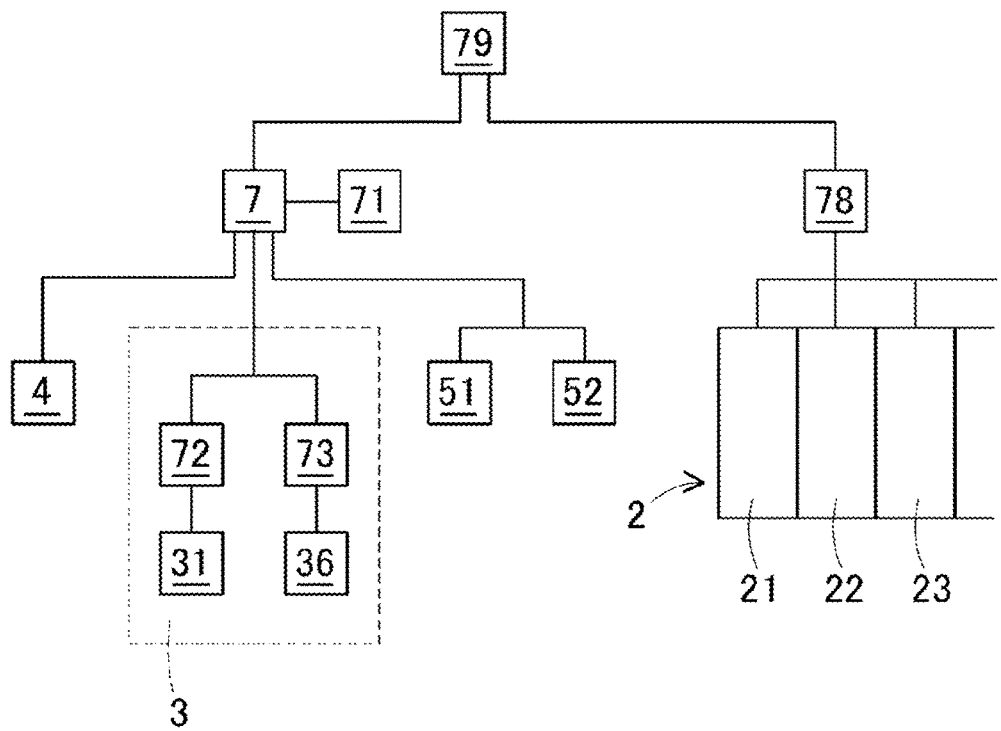
FIG. 8 is a block diagram illustrating a configuration of control of the substrate production system of the embodiment.

Next, a configuration of control of substrate production system 1 will be described with reference to FIG. 8. As illustrated in FIG. 8, substrate production system 1 includes setup control section 7. Setup control section 7 is communicatively connected to production management device 79. Production management device 79 is communicatively connected to line control section 78. Further, line control section 78 is communicatively connected to each of multiple types of substrate production machines including component mounter 22.

Production management device 79 manages a production plan and a production progress status of substrate K. The production plan includes information such as a substrate type, the production number, and a production order of substrates K to be produced. Line control section 78 controls the operation of substrate production line 2 based on the production plan received from production management device 79. In addition, line control section 78 sequentially transmits the production progress status in substrate production line 2 to production management device 79. Examples of the production progress status include information such as the number of production records of substrates K in component mounter 22 and the number of consumed components.

Setup control section 7 acquires the production plan of the substrate from production management device 79, and stores the acquired production plan in production plan storage section 71. In addition, setup control section 7 appropriately acquires the production progress status of line control section 78 via production management device 79. Setup control section 7 controls the setup of tape feeder 91 based on the production plan and the production progress status. Setup control section 7 controls the conveyance operation of conveyance device 4, as well as the traveling operation and the reloading operation of feeder conveyance vehicle 51 and reel conveyance vehicle 55. In addition, setup control section 7 issues instructions to kitting control section 72 and classification control section 73 of kitting station 3, and transmits required information.

Kitting control section 72 controls the progress of the kitting work and the removal work of reel 92 in kitting execution section 31. Kitting control section 72 can streamline the work based on the information received from setup control section 7. For example, kitting control section 72 can receive information on an arrangement position of multiple tape feeders 91 in magazine-type spare containing section 95 and information on a loading order of multiple reels 92 in reel magazine 96, and can select tape feeder 91 and reel 92, which are the work targets, in a short time without error.

Classification control section 73 controls the classification operation of classification section 36. Classification control section 73 can perform classification without error based on the information received from setup control section 7. For example, classification control section 73 can determine that reel 92 removed from tape feeder 91 is empty based on the information that tape feeder 91 is collected from component supply area 221 due to the component shortage. As a result, classification section 36 can correctly feed empty reel 92 to reel discarding section 35. In addition, classification control section 73 can determine that reel 92 removed from tape feeder 91 is half used based on the information that tape feeder 91 is collected from component supply area 221 in the setup change work accompanying the change of the substrate type. As a result, classification section 36 can correctly feed half-used reel 92 to magazine feed-out section 34.

7. Kitting Work (Including Description of Initial Waste Tape)

Next, the kitting work in kitting station 3 will be described with reference to FIG. 9. In FIG. 9, carrier tape 93 is illustrated in an exaggerated manner to be thicker than the actual carrier tape. Kitting control section 72 specifies tape feeder 91 and reel 92, which are the work targets, based on the instruction and the information received from setup control section 7, and issues an instruction to kitting execution section 31.

Kitting execution section 31 holds tape feeder 91 in which reel 92 is not set in feeder holding section 311 in response to the instruction. Tape feeder 91 in which reel 92 is not set is supplied from magazine-type spare containing section 95, or is contained in first spare containing section 37 or second spare containing section 224 and is conveyed in kitting execution section 31 by conveyance device 4. Next, kitting execution section 31 takes out reel 92 from reel magazine 96 and sets reel 92 in tape feeder 91.

Next, kitting execution section 31 pulls out carrier tape 93 from reel 92 to perform the predetermined loading work. In this case, kitting execution section 31 cuts a part of the distal end side of carrier tape 93. As illustrated in FIG. 9, a distal end portion of carrier tape 93 includes base tape 931, cover tape 932, adhesive seal 933, and seal grip 934.

In base tape 931, cavities for accommodating the components are formed in a line in the tape length direction. Some of the cavities on the distal end side are empty cavities that do not accommodate components. Cover tape 932 is adhered to an upper surface of base tape 931 to cover the cavity. Cover tape 932 extends from a distal end of base tape 931 to a front side. Adhesive seal 933 is adhered to a vicinity of a distal end of cover tape 932, and extends to a front side of the distal end of cover tape 932. Seal grip 934 is adhered to a distal end portion of adhesive seal 933.

As cutting position C1 of carrier tape 93, a distal end position of base tape 931 can be illustrated as an example (see FIG. 9). As a result of the cutting, the initial waste tape on the distal end side with respect to cutting position C1 is generated. Kitting execution section 31 loads the initial waste tape at the upper start point of collection slope 63. As a result, the initial waste tape slides down on collection slope 63 and is collected in collection box 61. Tape feeder 91 in the state ready for use in which reel 92 has been set is conveyed out from kitting execution section 31 by conveyance device 4.

8. Operations and Actions of Substrate Production System 1

Next, comprehensive operations and actions of substrate production system 1 will be described with reference to FIG. 10. Setup control section 7 prioritizes the setup of tape feeder 91 that is planned to be used in production, and postpones the setup of tape feeder 91 that is not planned to be used. Setup control section 7 further prioritizes the setup of tape feeder 91 that is planned to be used but is to be used at an earlier use period. FIG. 10 illustrates an example of five cases in which a reference of a containing position at which tape feeder 91 is contained is determined in accordance with the presence or absence of a use plan and the use period.

Tape feeder 91 that is planned to be used in production in the earliest order, in other words, tape feeder 91 having the highest priority is tape feeder 91 for component replenishment, which is required when the component shortage occurs in the substrate type that is currently being produced. Setup control section 7 can determine the necessity of tape feeder 91 for component replenishment based on the production plan and the production progress status. Setup control section 7 instructs kitting control section 72 to perform the kitting work of tape feeder 91 for component replenishment in advance before the component shortage actually occurs. Kitting control section 72 that has received the instruction controls the execution of the kitting work.

Further, setup control section 7 issues an instruction to conveyance device 4 to move tape feeder 91 for component replenishment to the upper stage of second spare containing section 224 closest to component supply area 221 among the spare containing sections. Conveyance device 4 that has received the instruction conveys tape feeder 91 from kitting station 3 to the upper stage of second spare containing section 224 so that tape feeder 91 is contained there. In addition, when the component shortage actually occurs, conveyance device 4 conveys tape feeder 91 in the upper stage of second spare containing section 224 to component supply area 221 and inserts tape feeder 91 into the slot. With this configuration, since a conveyance distance of tape feeder 91 is minimized, the work time required for component replenishment is minimized.

Tape feeder 91 having the second highest priority is tape feeder 91 for setup change, which is required when the production of the substrate type that is currently being produced is completed and the production proceeds to the substrate type to be produced next. Setup control section 7 can determine the necessity of tape feeder 91 for setup change based on the production plan. Setup control section 7 instructs kitting control section 72 to perform the kitting work of tape feeder 91 for setup change in advance before the setup change work actually occurs. Kitting control section 72 that has received the instruction controls the execution of the kitting work.

Further, setup control section 7 issues an instruction to conveyance device 4 to temporarily move tape feeder 91 for setup change to the lower stage of second spare containing section 224 that is the second closest to component supply area 221 among the spare containing sections. Conveyance device 4 that has received the instruction temporarily conveys tape feeder 91 from kitting station 3 to the lower stage of second spare containing section 224 to be contained.

Thereafter, setup control section 7 issues an instruction to conveyance device 4 to move tape feeder 91 for setup change to component supply area 221 at a predetermined timing based on the production plan, in other words, a timing at which the setup change work is required. Conveyance device 4 that has received the instruction conveys tape feeder 91 from the lower stage of second spare containing section 224 to component supply area 221, and inserts tape feeder 91 into the slot. Here, since the lower stage of second spare containing section 224 has a structure similar to component supply area 221, it is possible to contain the entire number of tape feeders 91 used in the setup change work. Therefore, the conveyance distance of tape feeder 91 in the setup change work is reduced, so that the work time is reduced.

Tape feeder 91 having the third highest priority is tape feeder 91 for setup change corresponding to the substrate type to be produced after the next substrate type, or the substrate type to be produced later than the substrate type after the next substrate type. After the kitting work is executed, tape feeder 91 having the third highest priority is conveyed from kitting execution section 31 to first spare containing section 37 on the lower side thereof by conveyance device 4, and is temporarily contained in first spare containing section 37.

Thereafter, when the production of the substrate type that is currently being produced is completed, the next substrate type is changed to the substrate type that is being produced, and the substrate type after the next substrate type is changed to the next substrate type. In this case, conveyance device 4 first conveys tape feeder 91 in the lower stage of second spare containing section 224 to component supply area 221 in the setup change work. Thereafter, conveyance device 4 conveys tape feeder 91 contained in first spare containing section 37 and corresponding to the next substrate type toward the empty space in the lower stage of second spare containing section 224, to be contained. This conveyance operation can be performed using a spare time.

Here, since kitting station 3 is provided in substrate production line 2, conveyance device 4 only needs to move a short distance when conveying tape feeder 91 from kitting station 3 to component mounter 22. Therefore, as compared with a conventional configuration in which the kitting station is provided at a distance from the substrate production line, conveyance device 4 can convey tape feeder 91 in a short distance and in a short time.

In addition, tape feeder 91 in which reel 92 that is no longer planned to be used in component mounter 22 is set is collected from component supply area 221 by conveyance device 4. Setup control section 7 determines the future handling for collected tape feeder 91. For example, for tape feeder 91 in which reel 92 is half used and reuse of reel 92 is expected in consideration of the production record or the like, setup control section 7 issues an instruction to conveyance device 4 to maintain the state in which reel 92 is set. Conveyance device 4 that has received the instruction conveys tape feeder 91 collected from component mounter 22 to first spare containing section 37 to be contained. In this case, since conveyance device 4 only needs to move a short distance, the conveyance can be performed in a short time.

In addition, for tape feeder 91 in which it is unclear whether to reuse reel 92 even when reel 92 is half used, setup control section 7 issues instructions to conveyance device 4 and kitting control section 72 to remove reel 92. Conveyance device 4 that has received the instruction conveys collected tape feeder 91 to kitting execution section 31. Kitting execution section 31 removes half-used reel 92 from tape feeder 91 under the control of kitting control section 72.

Thereafter, tape feeder 91 is used in multiple occasions by performing the kitting work of another reel 92. Tape feeder 91 can be efficiently used in multiple occasions by the conveyance in a short distance and a short time between kitting station 3 and component mounter 22. In contrast, in the conventional configuration, since tape feeder 91 is conveyed between the substrate production line and the kitting station that are disposed at a distance by using the conveyance vehicle, there is a restriction on the conveyance operation. In other words, in order to efficiently convey multiple tape feeders 91 collectively, it is common for the conveyance vehicle to wait until multiple tape feeders 91 are arranged, so that it is difficult to efficiently use tape feeder 91 in multiple occasions. Therefore, with the present embodiment, the number of spare tape feeders 91 can be reduced as compared with the conventional art.

In addition, tape feeder 91 that does not require to be used in multiple occasions after reel 92 is removed is fed to magazine-type spare containing section 95 of spare containing section attachment and detachment section 32, and is conveyed and stored in feeder storage warehouse 53 by feeder conveyance vehicle 51. It should be noted that, in a case where there is an empty space in first spare containing section 37 or second spare containing section 224, tape feeder 91 from which reel 92 is removed is allowed to be contained. Meanwhile, half-used reel 92 is fed to reel magazine 96 of magazine feed-out section 34 by classification section 36, and is conveyed and stored in reel storage warehouse 57 by reel conveyance vehicle 55.

Further, for tape feeder 91 collected in a state in which reel 92 is empty, setup control section 7 issues the instructions to conveyance device 4 and kitting control section 72 to remove empty reel 92. Conveyance device 4 that has received the instruction conveys collected tape feeder 91 to kitting execution section 31. Kitting execution section 31 removes empty reel 92 from tape feeder 91 under the control of kitting control section 72.

Thereafter, tape feeder 91 is used in multiple occasions by performing the kitting work of another reel 92, or is stored in feeder storage warehouse 53 by feeder conveyance vehicle 51. Empty reel 92 is fed to reel discarding section 35 by classification section 36 and discarded.

The operation of conveyance device 4 in the above description will be summarized. Conveyance device 4 temporarily conveys tape feeder 91 in which reel 92 is set by kitting station 3 to second spare containing section 224, and conveys tape feeder 91 in which reel 92 is set from second spare containing section 224 to component supply area 221 at the predetermined timing based on the production plan.

In addition, based on the production plan, conveyance device 4 preferentially conveys tape feeder 91 in which reel 92 that is not planned to be used in production is set to first spare containing section 37 and preferentially causes conveyed tape feeder 91 to be contained in first spare containing section 37, and preferentially conveys tape feeder 91 in which reel 92 that is planned to be used in production is set to second spare containing section 224 and preferentially causes conveyed tape feeder 91 to be contained in second spare containing section 224. Further, based on the production plan, conveyance device 4 preferentially convey tape feeder 91 in which reel 92 that is planned to be used in production in a later order is set to first spare containing section 37 and preferentially causes conveyed tape feeder 91 to be contained in first spare containing section 37, and preferentially convey tape feeder 91 in which reel 92 that is planned to be used in production in an earlier order is set to second spare containing section 224 and preferentially causes conveyed tape feeder 91 to be contained in second spare containing section 224.

In substrate production system 1 of the embodiment, kitting station 3 is provided in substrate production line 2. Therefore, conveyance device 4 only needs to move a short distance when conveying tape feeder 91 (component supply unit) in which reel 92 (component container) is set from kitting station 3 to component mounter 22, so that the conveyance can be performed in a short time. Therefore, it is possible to streamline the component replenishment work and the setup change work related to component mounter 22, and as a result, it is possible to realize high production efficiency. In addition, since the use of tape feeder 91 in multiple occasions is streamlined by the conveyance in a short time, the restriction on the number of spare tape feeders 91 is mitigated.

9. Applications and Modifications of Embodiment

It should be noted that the method of using first spare containing section 37 and second spare containing section 224 is not limited to the above description and the reference illustrated in FIG. 10, and can be appropriately changed in accordance with the containing capacity of each spare containing section, the margin of the number of spare tape feeders 91, or the like. The combination of the component supply unit and the component container is not limited to the combination of tape feeder 91 and reel 92 described in the embodiment, and may be, for example, a combination of a stick feeder and a component containing stick. Further, the configuration of substrate production line 2 can be variously modified. The embodiment may be variously applied or modified.

REFERENCE SIGNS LIST

1: substrate production system, 2: substrate production line, 22: component mounter, 221: component supply area, 222: mounting head, 223: suction nozzle, 224: second spare containing section, 3: kitting station, 31: kitting execution section, 32: spare containing section attachment and detachment section, 33: magazine accepting section, 34: magazine feed-out section, 35: reel discarding section, 36: classification section, 37: first spare containing section, 4: conveyance device, 51: feeder conveyance vehicle, 53: feeder storage warehouse, 55: reel conveyance vehicle, 57: reel storage warehouse, 6: waste tape collection device, 61: collection box, 62: waste tape conveyor, 63: collection slope, 7: setup control section, 71: production plan storage section, 72: kitting control section, 73: classification control section, 78: line control section, 79: production management device, 91: tape feeder, 92: reel, 93: carrier tape, 95: magazine-type spare containing section, 96: reel magazine, K: substrate

The invention claimed is:

1. A substrate production system comprising:
a component mounter having a component supply area in which a component supply unit is disposed, and configured to pick up a component from the component supply unit and mount the picked up component on a substrate;
a kitting station provided in a substrate production line in which multiple substrate production machines including the component mounter are arranged, and configured to set a component container containing multiple components in the component supply unit; and
a conveyance device configured to convey the component supply unit in which the component container is set by the kitting station to the component mounter; and
a production plan storage section configured to store a production plan of the substrate,
wherein the conveyance device is configured to, based on the production plan, collect the component supply unit in which the component container that is not planned to be used in production is set from the component supply area and convey the collected component supply unit to the kitting station, and
wherein the kitting station is configured to remove the component container from the collected component supply unit.

2. The substrate production system according to claim 1, wherein the kitting station includes a classification section configured to classify the component container removed from the component supply unit into the component container that is empty and the component container in which the component still remains.

3. The substrate production system according to claim 1, further comprising:
a spare containing section provided in at least one of the substrate production line and the kitting station, and configured to contain the component supply unit that is not used in present production.

4. The substrate production system according to claim 1, further comprising:
a production plan storage section configured to store a production plan of the substrate; and
a spare containing section provided in at least one of the substrate production line and the kitting station, and configured to contain the component supply unit that is not used in present production,
wherein the conveyance device is configured to
temporarily convey the component supply unit in which the component container is set by the kitting station to the spare containing section, and
convey the component supply unit in which the component container is set from the spare containing section to the component supply area at a predetermined timing based on the production plan.

5. The substrate production system according to claim 4, wherein the spare containing section includes a first spare containing section provided in the kitting station and a second spare containing section provided in the component mounter, and
the conveyance device is configured to, based on the production plan,
preferentially convey the component supply unit in which the component container that is not planned to be used in production is set to the first spare containing section and cause the preferentially conveyed component supply unit to be contained in the first spare containing section, and
preferentially convey the component supply unit in which the component container that is planned to be used in production is set to the second spare containing section and cause the preferentially conveyed component supply unit to be contained in the second spare containing section.

6. The substrate production system according to claim 4, wherein the spare containing section includes a first spare containing section provided in the kitting station and a second spare containing section provided in the component mounter, and
the conveyance device is configured to, based on the production plan,
preferentially convey the component supply unit in which the component container that is planned to be used in production in a later order is set to the first spare containing section and cause the preferentially conveyed component supply unit to be contained in the first spare containing section, and
preferentially convey the component supply unit in which the component container that is planned to be used in production in an earlier order is set to the second spare containing section and cause the preferentially conveyed component supply unit to be contained in the second spare containing section.

7. The substrate production system according to claim 3, wherein the kitting station includes a spare containing section attachment and detachment section in which a magazine-type spare containing section configured to contain multiple component supply units is detachably provided.

8. The substrate production system according to claim 1, wherein the kitting station includes a magazine attachment and detachment section in which a component container magazine configured to contain multiple component containers is detachably provided.

9. The substrate production system according to claim 1, further comprising:
a conveyance vehicle configured to convey at least one of the component container and the component supply unit between the kitting station and a storage warehouse.

10. The substrate production system according to claim 1, wherein the component container is a reel around which a carrier tape containing the multiple components is wound,
the component supply unit is a tape feeder configured to pull out the carrier tape from the reel and feed the pulled out carrier tape, and
the substrate production system further comprises a waste tape collection device configured to collect an initial waste tape generated in a case where the kitting station sets the reel in the tape feeder.

11. The substrate production system according to claim 10, wherein the waste tape collection device is configured to also collect a waste tape generated after the component mounter uses the carrier tape.

12. A substrate production system comprising:
a component mounter having a component supply area in which a component supply unit is disposed, and configured to pick up a component from the component supply unit and mount the picked up component on a substrate;
a kitting station provided in a substrate production line in which multiple substrate production machines including the component mounter are arranged, and configured to set a component container containing multiple components in the component supply unit;
a conveyance device configured to convey the component supply unit in which the component container is set by the kitting station to the component mounter;
a production plan storage section configured to store a production plan of the substrate; and
a spare containing section provided in at least one of the substrate production line and the kitting station, and configured to contain the component supply unit that is not used in present production,
wherein the conveyance device is configured to
temporarily convey the component supply unit in which the component container is set by the kitting station to the spare containing section, and
convey the component supply unit in which the component container is set from the spare containing section to the component supply area at a predetermined timing based on the production plan.

13. A substrate production system comprising:
a component mounter having a component supply area in which a component supply unit is disposed, and configured to pick up a component from the component supply unit and mount the picked up component on a substrate;
a kitting station provided in a substrate production line in which multiple substrate production machines including the component mounter are arranged, and configured to set a component container containing multiple components in the component supply unit; and
a conveyance device configured to convey the component supply unit in which the component container is set by the kitting station to the component mounter,
wherein the kitting station includes a magazine attachment and detachment section in which a component container magazine configured to contain multiple component containers is detachably provided.

* * * * *